US010665393B2

(12) United States Patent
Ryou et al.

(10) Patent No.: US 10,665,393 B2
(45) Date of Patent: May 26, 2020

(54) CAPACITOR AND BOARD HAVING THE SAME

(71) Applicant: SAMSUNG ELECTRO-MECHANICS CO., LTD., Suwon-si, Gyeonggi-do (KR)

(72) Inventors: Jeong Hoon Ryou, Suwon-si (KR); Dong Sik Yoo, Suwon-si (KR); Seung Hun Han, Suwon-si (KR); No Il Park, Suwon-si (KR); Seung Mo Lim, Suwon-si (KR); Hyun Ho Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 37 days.

(21) Appl. No.: 15/709,073

(22) Filed: Sep. 19, 2017

(65) Prior Publication Data
US 2018/0315550 A1    Nov. 1, 2018

(30) Foreign Application Priority Data

Apr. 26, 2017   (KR) .......................... 10-2017-0053675

(51) Int. Cl.
*H01G 4/33*    (2006.01)
*H01G 4/012*   (2006.01)
(Continued)

(52) U.S. Cl.
CPC ............... *H01G 4/33* (2013.01); *H01G 2/06* (2013.01); *H01G 4/012* (2013.01); *H01G 4/252* (2013.01);
(Continued)

(58) Field of Classification Search
CPC ........... H01G 4/33; H01G 4/252; H01G 4/012
See application file for complete search history.

(56) References Cited

U.S. PATENT DOCUMENTS 7,829,409 B2 * 11/2010 Onishi .................... H01G 4/01
                                                      257/E21.008
8,064,189 B2 * 11/2011 Masuda ................ H01G 4/005
                                                      361/303
(Continued)

FOREIGN PATENT DOCUMENTS

KR    10-2011-0097334 A    8/2011
KR       10-1108947 B1     1/2012
(Continued)

OTHER PUBLICATIONS

Nongaillard, et.al, "Design for manufacturing of 3D capacitors", Microelectronics Journal, vol. 41, 2010, pp. 845-850.
(Continued)

*Primary Examiner* — Nathan Milakovich
(74) *Attorney, Agent, or Firm* — Morgan, Lewis & Bockius LLP

(57) ABSTRACT

A capacitor includes a support member included in a body, a plurality of pillars disposed in an upper portion of the support member and each having a lower portion wider than an upper portion, and a capacitor layer disposed on a side surface and an upper surface of each pillar and including a dielectric layer and first and second electrodes alternately disposed with the dielectric layer interposed therebetween. Lower end portions of adjacent pillars are in contact with each other.

12 Claims, 9 Drawing Sheets

(51) Int. Cl.
  *H01G 4/252* (2006.01)
  *H05K 1/18* (2006.01)
  *H01G 2/06* (2006.01)
  *H01G 4/224* (2006.01)
  *H05K 1/14* (2006.01)
  *H01G 4/38* (2006.01)
(52) U.S. Cl.
  CPC ............. *H05K 1/181* (2013.01); *H01G 4/224* (2013.01); *H01G 4/38* (2013.01); *H05K 1/144* (2013.01); *H05K 2201/042* (2013.01); *H05K 2201/10015* (2013.01); *H05K 2201/10522* (2013.01); *H05K 2201/10545* (2013.01); *H05K 2201/10734* (2013.01)

(56) References Cited

U.S. PATENT DOCUMENTS

| | | | | |
|---|---|---|---|---|
| 8,085,524 | B2* | 12/2011 | Roozeboom | H01L 27/0805 |
| | | | | 361/301.2 |
| 8,283,750 | B2 | 10/2012 | Guiraud et al. | |
| 8,470,668 | B2* | 6/2013 | Cho | H01L 27/10852 |
| | | | | 438/243 |
| 8,502,340 | B2* | 8/2013 | Oganesian | H01L 23/481 |
| | | | | 257/532 |
| 9,412,806 | B2* | 8/2016 | Wang | H01L 28/65 |
| 2011/0204427 | A1 | 8/2011 | Choi et al. | |
| 2012/0019980 | A1 | 1/2012 | Cho et al. | |
| 2012/0146182 | A1 | 6/2012 | Oganesian et al. | |
| 2012/0176751 | A1* | 7/2012 | Sakai | H01Q 1/38 |
| | | | | 361/746 |
| 2014/0092524 | A1 | 4/2014 | Kim et al. | |
| 2017/0213650 | A1* | 7/2017 | Fishburn | H01G 4/385 |

FOREIGN PATENT DOCUMENTS

KR 10-2012-0009717 A 2/2012
KR 10-1422923 B1 7/2014

OTHER PUBLICATIONS

McCutcheon, "Deflections and stresses in circular tapered beams and poles", Civil Engineering for Practicing and Design Engineers, vol. 2, 1983, pp. 1-21.

Korean Office Action issued in corresponding Korean Patent Application No. 10-2017-0053675, dated Jan. 17, 2018, with English Translation.

Office Action issued in corresponding Korean Patent Application No. 10-2017-0053675, dated Jul. 17, 2018.

* cited by examiner

CAPACITOR AND BOARD HAVING THE SAME

CROSS-REFERENCE TO RELATED APPLICATION(S)

This application claims benefit of priority to Korean Patent Application No. 10-2017-0053675 filed on Apr. 26, 2017 in the Korean Intellectual Property Office, the disclosure of which is incorporated herein by reference in its entirety.

TECHNICAL FIELD

The present disclosure relates to a capacitor and a board having the same.

BACKGROUND

Recently, portable IT products such as smartphones, wearable devices, and the like, have been reduced in thickness. Thus, passive elements are increasingly required to be reduced in thickness to reduce a thickness of an overall package.

To this end, demand for thin film capacitors having a thickness smaller than that of multilayer ceramic capacitors has increased.

A thin film capacitor advantageously realizes a thin capacitor using thin film technology.

Also, unlike the related art multilayer ceramic capacitor, such a thin film capacitor has low equivalent series inductance (ESL), and thus, the application of the thin film capacitor as a decoupling capacitor for an application processor (AP) has been reviewed.

In order to use the thin film capacitor as a decoupling capacitor for an application processor, the thin film capacitor is manufactured as a land-side capacitor (LSC).

However, an existing embedded capacitor is impossible to rework when it is defective, increasing overall loss costs, and thus, it is necessary to realize a thin film capacitor as a reworkable land-side capacitor.

Since the land-side capacitor type thin film capacitor is placed between solder balls, it is required to be designed to be as small as possible to minimize an area from which a solder ball is to be removed.

In addition, in order to increase capacity of a thin film capacitor, research into the application of a pillar-type structure, capable of increasing a surface area implementing capacity to a thin film capacitor, has been conducted.

However, the pillar structure has a problem, in that formation of a thin, high pillar, aiming at increasing capacity, is restricted in terms of a process and material.

Thus, a novel structure capable of increasing an overall surface area, while considering difficulty in a manufacturing process and limitations of a material itself, is required.

SUMMARY

An aspect of the present disclosure may provide a capacitor having a structure capable of significantly enhancing capacity of the capacitor, and a board having the capacitor.

According to an aspect of the present disclosure, a capacitor may include: a support member included in a body; a plurality of pillars disposed in an upper portion of the support member and each having a lower portion wider than an upper portion; and a capacitor layer disposed on a side surface and an upper surface of each pillar and including a dielectric layer and first and second electrodes alternately disposed with the dielectric layer interposed therebetween. Lower end portions of adjacent pillars are in contact with each other.

According to another aspect of the present disclosure, a mounting board having the aforementioned capacitor may include: a board; a semiconductor chip disposed on one surface of the board; and a capacitor disposed on the other surface of the board opposing the one surface. The capacitor includes: a support member included in a body; a plurality of pillars disposed in an upper portion of the support member and having a lower portion wider than an upper portion; and a capacitor layer disposed on a side surface and an upper surface of each pillar and including a dielectric layer and first and second electrodes alternately disposed with the dielectric layer interposed therebetween. Lower end portions of adjacent pillars are in contact with each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
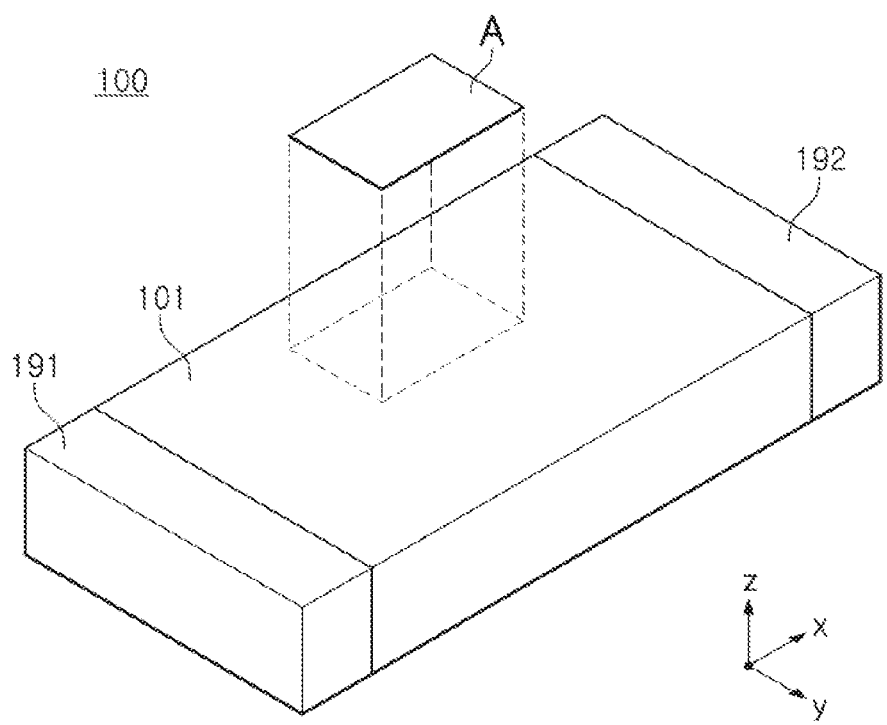
FIG. 1 is a schematic perspective view of a capacitor according to an exemplary embodiment in the present disclosure.

Exemplary embodiments in the present disclosure will now be described in detail with reference to the accompanying drawings.

In the drawings, an X direction, a Y direction, and a Z direction may be expressed as a width direction, a length direction, and a thickness direction.

Capacitor

Figure 2:
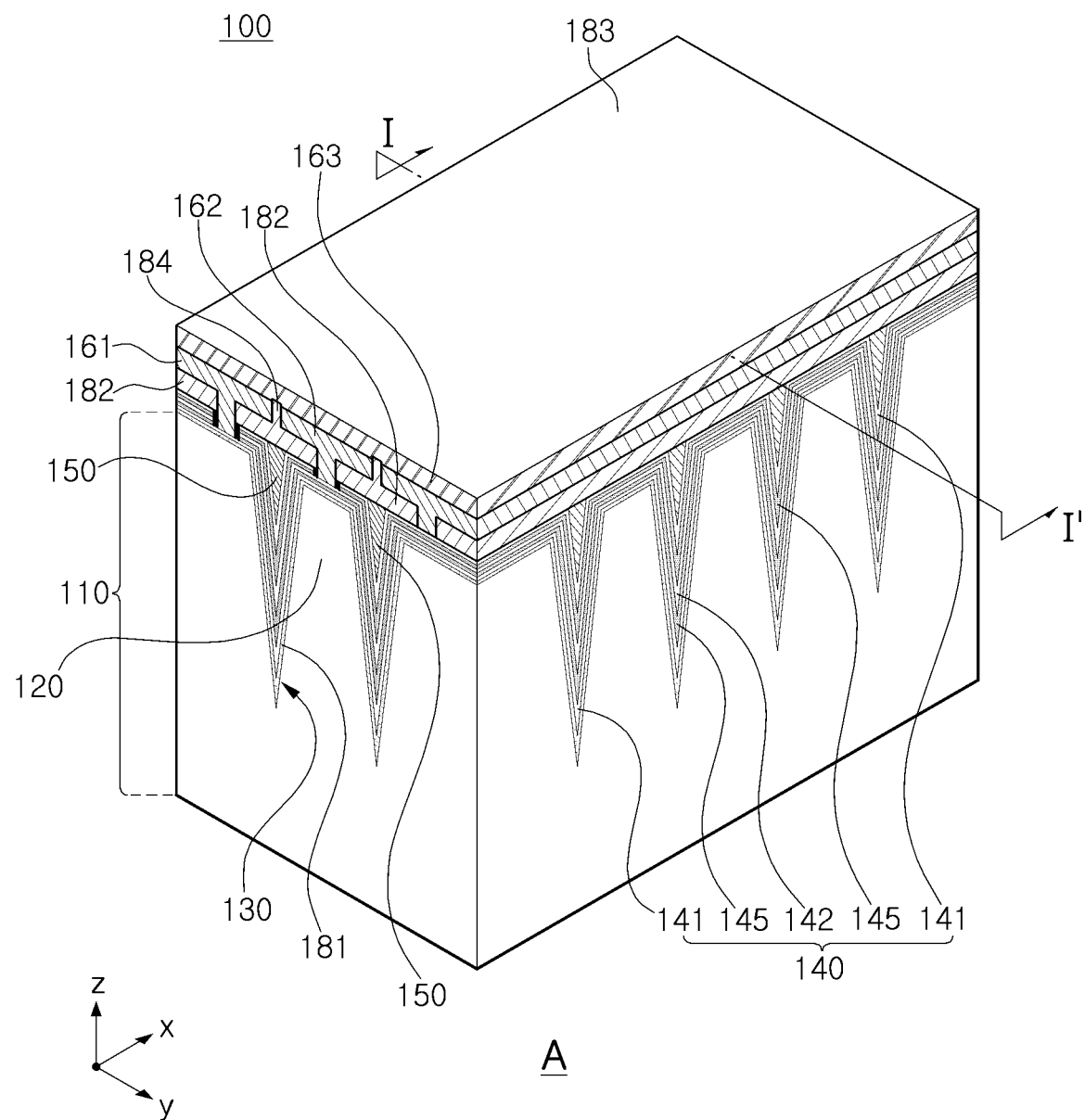
FIG. 2 is a schematic partial perspective view of part "A" of FIG. 1.
Figure 3:
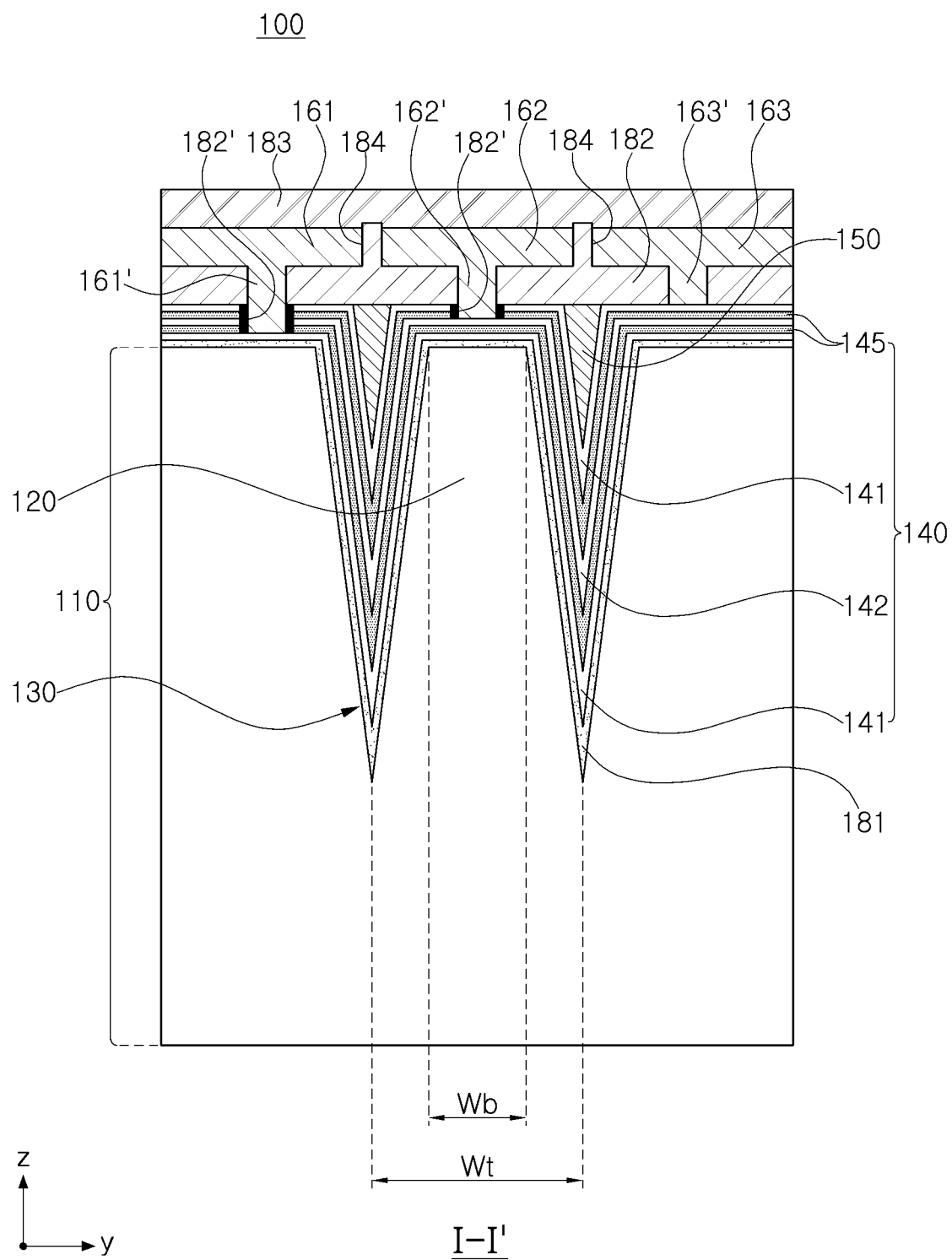
FIG. 3 is a schematic cross-sectional view taken along line I-I' of FIG. 2.
Figure 4:
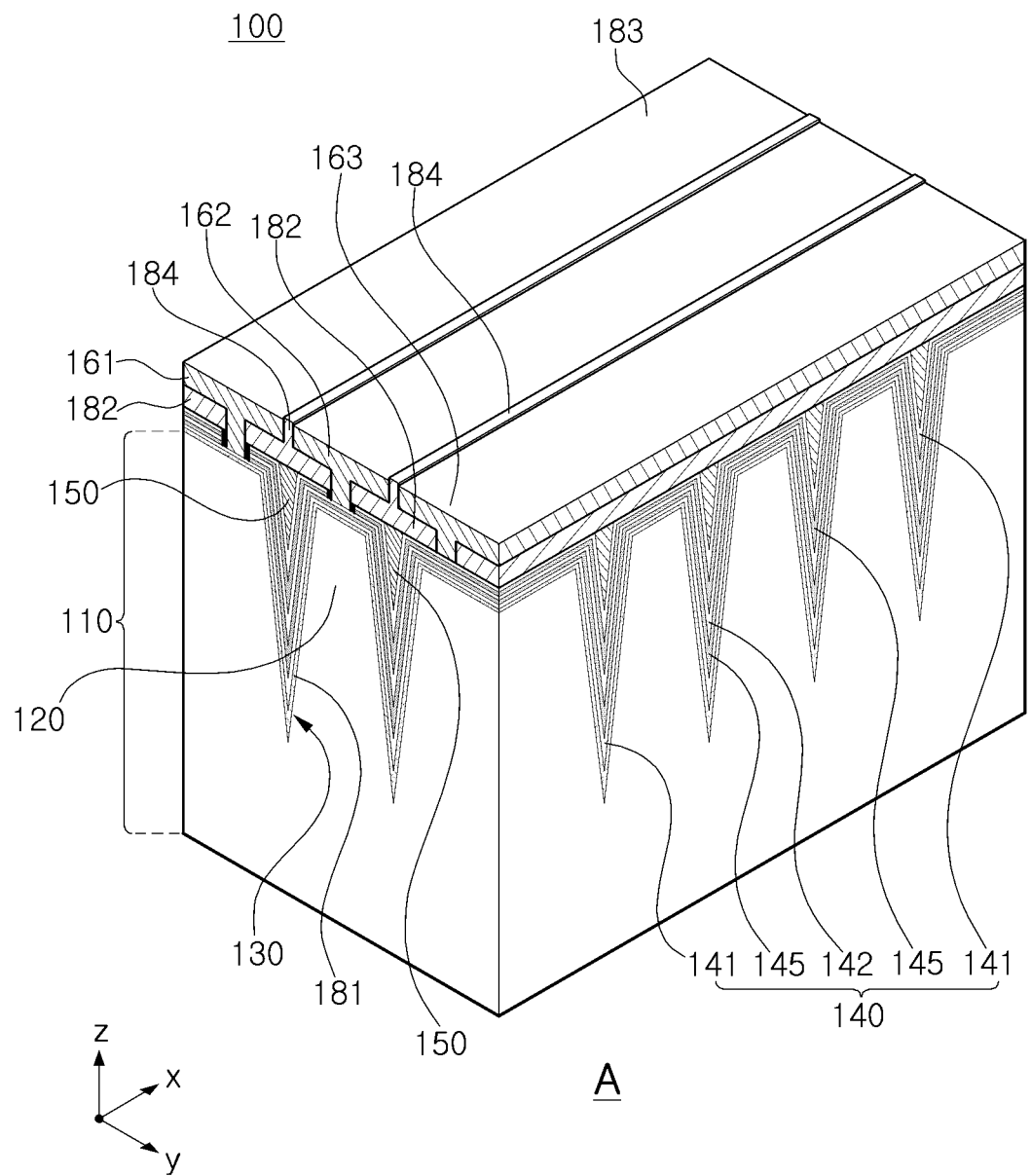
FIG. 4 is a schematic partial perspective view of the part "A" of FIG. 1, illustrating a configuration without a cover layer.
Figure 5:
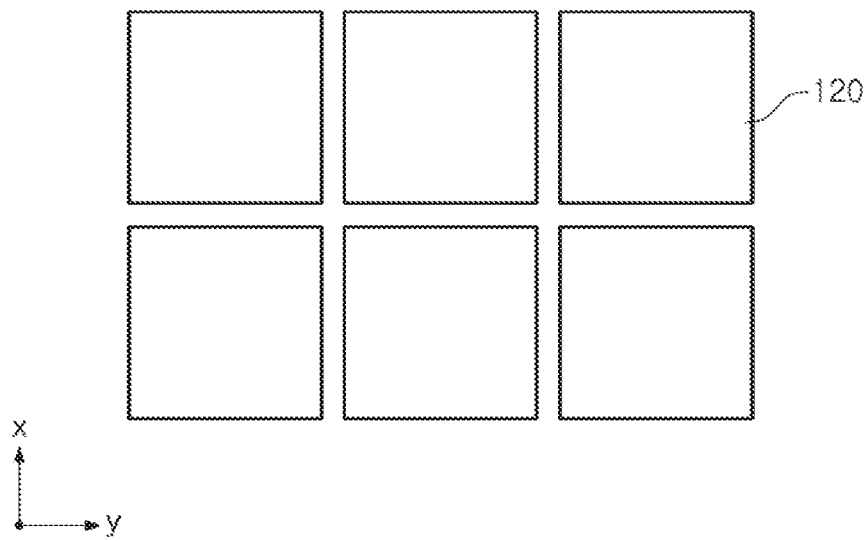
FIGS. 5 to 8 are schematic top plan views of a pillar.
Figure 6:
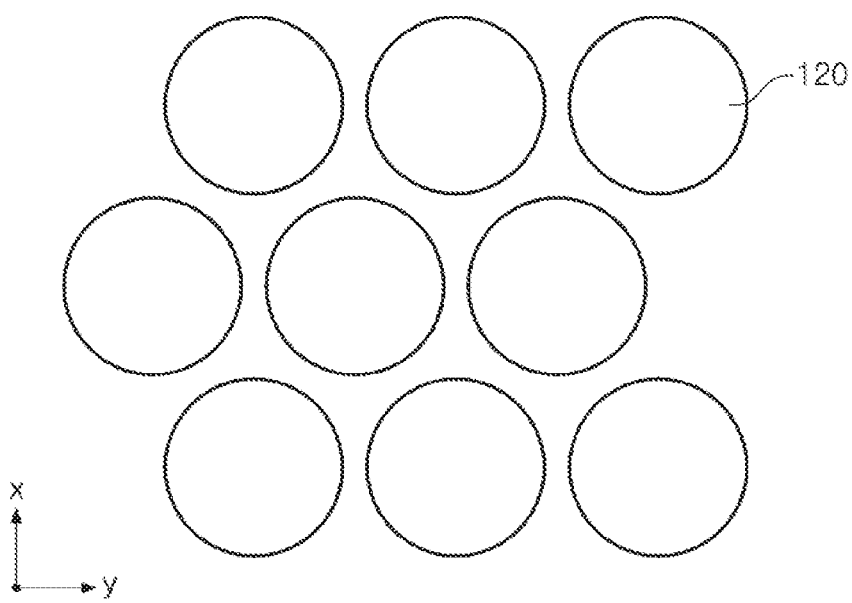
Figure 7:
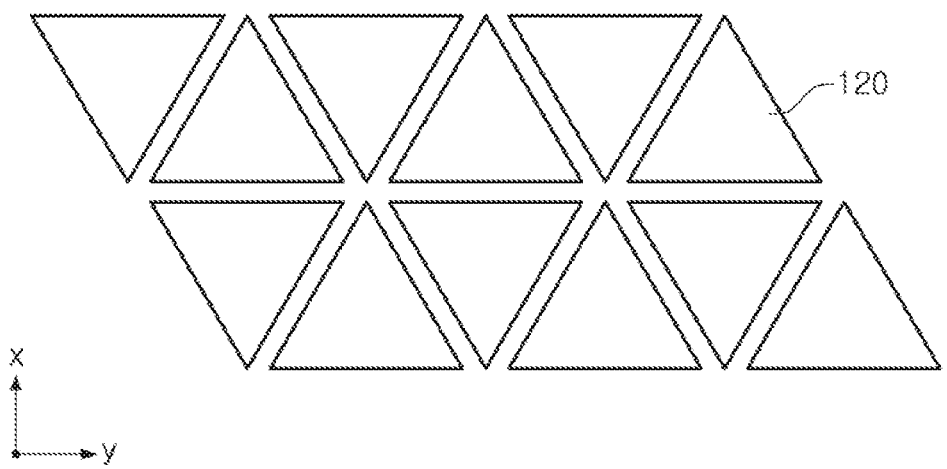

FIG. 1 is a schematic perspective view of a capacitor according to an exemplary embodiment in the present disclosure, FIG. 2 is a schematic partial perspective view of part "A" of FIG. 1, FIG. 3 is a schematic cross-sectional view taken along line I-I' of FIG. 2, and FIG. 4 is a schematic partial perspective view of the part "A" of FIG. 1, illustrating a configuration without a cover layer.

A structure of a capacitor according to an exemplary embodiment in the present disclosure will be described with reference to FIGS. 1 to 4.

A capacitor 100 includes a body 101 and first and second external electrodes 191 and 192 disposed on an external surface of the body 101.

The body 101 may generally have, but not limited to, a hexahedral shape. Also, the body 101 may be a body of a multi-layered, high-capacitance thin film capacitor having a size of 0.6 mm×0.3 mm and capacitance of 1.0 μF or greater, for example, but without being limited thereto.

The body 101 includes a support member 110. The support member 110 may be any one selected from the group consisting of Si, $SiO_2$, $Al_2O_3$, MgO, $LaAlO_3$, and $SrTiO_3$, or any combinations thereof.

A pillar 120 protruding to one surface is disposed in an upper portion of the support member 110. The pillar 120 may be formed by selectively etching upper portions of the flat support member 110.

The pillar 120 may be disposed in plural in the first direction (X) and the second direction (Y). The pillar 120 may have a pyramidal shape with a cut upper surface. The cut upper surface may be a flat surface.

The pillar 120 may be formed of the same material as that of the support member 110, but is not limited thereto. For example, a layer may be formed of a material different from that of the support member 110 on an upper portion of the support member 110 and subsequently be etched to form a pillar.

The pillar 120 of the capacitor 100 according to an exemplary embodiment in the present disclosure may be formed such that a width of a lower portion thereof is wider than that of an upper portion thereof.

The pillar-type capacitor is advantageous in an etching process due to smooth movement of a gas generated during the etching process, compared with a trench or groove type capacitor.

In particular, due to the advantage in process, the pillar type capacitor has an advantage of an increase in a surface area on which a capacitor layer may be formed, compared with the trench or groove type capacitor.

In order to increase the surface area on which a capacitor layer may be formed, it is necessary to form thin, long pillars and dispose pillars densely in each unit area.

However, when an aspect ratio of pillars is increased and pillars are disposed densely in each unit area, pillars may be stuck to each other during a process due to an increase in structural ductility of the pillars.

In particular, when the pillars are stuck to each other, the pillars are not easily separated from each other due to adhesion caused by Van der Walls force, electrostatic force, and the like.

If a dielectric layer and an electrode layer are formed, without addressing the problem that the pillars stick to each other, a dielectric layer, an electrode layer, and the like, cannot be deposited between the stuck pillars. Also, although a dielectric layer, an electrode layer, and the like, are deposited between the stuck pillars, capacitance of the capacitor may be reduced due to a reduction in a surface area.

In addition, when voids between the stuck pillars are neglected, air within the voids may be thermally expanded during a process performed at high temperature, among processes to form the capacitor, causing cracks in the capacitor.

In order to solve the aforementioned problems, there has been an attempt to design a pillar with a plan cross-section having a tripod shape. With the tripod-shaped structure, however, a size of the pillars is large and a distance between the pillars is large to eliminate the inter-pillar sticking problem but a surface area on which a capacitor layer is formed may be reduced to reduce capacitance.

However, in the capacitor 100 according to an exemplary embodiment in the present disclosure, the pillar 120 is formed such that a width of a lower portion thereof is greater than a width of an upper portion thereof, increasing effective rigidity of the pillar 120, and thus, sticking between pillars 120 may be prevented.

In detail, when the pillar 120 is designed such that a width of a flat cross-section (an X-Y plane) is decreased from a portion (which refers to a fixed end of the pillar 120) where the pillar 120 and the support member 110 are in contact toward an end portion of the pillar 120 (which refers to a free end of the pillar 120) ($W_t/W_b<1$), valid rigidity ($k_{eff}$) is increased to increase bending strength of the pillar 120.

In this manner, since the problem of sticking between the pillars 120 is solved as the bending strength of the pillars 120 is increased, the lower end portions (fixed ends) of the pillars 120 are in contact with each other. That is, a lower end portion of another pillar 120 starts from a point at which a lower end portion of one pillar 120 ends.

Accordingly, the lower end portions of the adjacent pillars 120 are in contact to form a recess 130, and such a recess 130 may have a V shape.

A capacitor layer 140 including a dielectric layer 145 and first and second electrodes 141 and 142 alternately disposed with the dielectric layer 145 interposed therebetween is disposed on the pillar 120. For example, the capacitor layer 140 may be disposed on an upper surface of the pillar 120 and a side surface of the pillar 120 (in the recess 130 between pillars).

An insulating layer 181 may be disposed on a surface of the pillar 120, i.e., on the upper surface of the pillar 120 and the side surface. The insulating layer 181 may be a silicon oxide ($SiO_2$) but is not limited thereto.

The insulating layer 181 disposed on the surface of the pillar 120 may minimize a short circuit which may occur between the first electrode 141 of the capacitor layer 140 and the support member 110.

The capacitor layer 140 may include at least one dielectric layer 145. For example, referring to FIG. 3, in cases in which two dielectric layers 145 are included, the first electrode 141, the dielectric layer 145, the second electrode 142, the dielectric layer 145, and the first electrode 141 may be sequentially stacked on the pillar 120. Hereinafter, the capacitor 100 will be described according to an exemplary embodiment in the present disclosure on the basis of the embodiment in which two dielectric layers 145 are included but the capacitor 100 is not limited thereto.

The first and second electrodes 141 and 142 may be formed using a conductive material. A material of the first and second electrodes 141 and 142 may be determined according to a material used to form the dielectric layer 145. When the dielectric layer 145 is formed of a paraelectric such as a metal oxide, or the like, a material of the first and second electrodes 141 and 142 may include a metal nitride. For example, the first and second electrodes 141 and 142 may be TiN, but is not limited thereto.

The first and second electrodes 141 and 142 may be formed using an atomic layer deposition (ALD) or atomic vapor deposition (AVD) process but is not limited thereto.

The dielectric layer 145 may be formed of a paraelectric such as a metal oxide, or the like. The dielectric layer 145 may include any one of metal oxides such as $Al_2O_3$, $ZrO_2$, and $HfO_2$ or any combinations thereof. The dielectric layer 145 may be formed to include a metal oxide such as $Al_2O_3$, $ZrO_2$, or $HfO_2$ as a single material. Alternatively, the dielectric layer 145 may be formed as a composite layer to enhance short circuit characteristics. When the dielectric layer 145 is a composite layer, the dielectric layer 145 may be a $ZrO_2$—$Al_2O_3$—$ZrO_2$ composite layer.

The dielectric layer 145 may be formed using an ALD or AVD process but is not limited thereto.

The first electrode 141 and the second electrode 142 may be disposed to face each other with the dielectric layer 145 interposed therebetween to form a capacitor.

That is, since the first electrode 141 and the second electrode 142 are alternately disposed with the dielectric layer 145 interposed therebetween, the capacitor layer 140 has a metal-insulator-metal (MIM) structure.

A filler 150 may fill the remaining space between adjacent pillars after the capacitor layer 140 is disposed on the adjacent pillars 120, such that cracks caused by thermal expansion of air trapped in a void in a central upper portion of the adjacent pillars 120 during a high temperature process can be prevented.

The filler 150 may be a conductor such as tungsten (W) or polysilicon. When the filler 150 is a conductor, the filler 150 may significantly reduce resistance within an electrode adjacent thereto. When the filler 150 is tungsten (W), a heat treatment at high temperature is not required, unlike polysilicon. For example, the filler 150 may be formed by sputtering tungsten (W).

An insulating layer 182 may be disposed on the capacitor layer 140. The insulating layer 182 disposed on the capacitor layer 140 may be formed of a silicon oxide ($SiO_2$) or a polymer material (e.g., epoxy), but is not limited thereto.

First connection electrodes 161 and 163 and a second connection electrode 162 are disposed on the insulating layer 182. The first connection electrodes 161 and 163 refer to electrodes electrically connected to the first electrode 141 and the second connection electrode 162 refers to an electrode electrically connected to the second electrode 142. The first connection electrodes 161 and 163 and the second connection electrode 162 may be connected to different polarities of electricity when connected to an external power source.

Among the first connection electrodes 161 and 163, the first connection electrode 161 connected to the first electrode 141 positioned first from below in a stacking direction is electrically connected to the first electrode 141 positioned first from below in the stacking direction through a first via electrode 161'. The first via electrode 161' may penetrate through the first insulating layer 182 from the first connection electrode 161 and penetrate through even the first electrode 141 of the capacitor layer 140 positioned first from below in the stacking direction. Here, an insulating layer 182' may be disposed between the first via electrode 161' and the second electrode 141 and between the first via electrode 161' and an upper first electrode 141, except a lower first electrode 141 connected to the first via electrode 161'. That is, the first via electrode 161' may be disposed to connect the first connection electrode 161 and one first electrode 141.

The second connection electrode 162 connected to the second electrode 142 is electrically connected to the second electrode 142 through a second via electrode 162'. The second via electrode 162' may penetrate through the insulating layer 182 from the second connection electrode 162 and also penetrate through even the second electrode 142 of the capacitor layer 140. Here, an insulating layer 182' may be disposed between the second via electrode 162' and the upper first electrode 141, except the second electrode 142 connected to the second via electrode 162'. That is, the second via electrode 162' may be disposed to connect the second connection electrode 162 and one second electrode 142.

Among the first connection electrodes 161 and 163, the first connection electrode 163 connected to the first electrode 141 positioned secondly from below in the stacking direction is electrically connected to the first electrode 141 positioned secondly from below in the stacking direction through a first via electrode 163'. The first via electrode 161' may penetrate through the insulating layer 182 from the first connection electrode 163 and may also penetrate through even the first electrode 141 of the capacitor layer 140 positioned secondly from below in the stacking direction. Here, an insulating layer 182' may be disposed between the first via electrode 163' and another second electrode 141 and between a first via electrode 163' and another first electrode 143, except for the first electrode 141 connected to the first via electrode 163'. That is, the first via electrode 163' may be disposed to connect the first connection electrode 163 and one first electrode 141.

The first via electrodes 161' and 163' and the second via electrode 162' may be formed by forming vias in at least some of positions of the insulating layer 182 corresponding to the upper surface of the pillar 120 and filling the vias with a conductive material.

The first connection electrodes 161 and 163 and the second connection electrode 162 are disposed on the insulating layer 182. The first connection electrodes 161 and 163 and the second connection electrode 162 may extend in the first direction (X). The insulating layer 184 is disposed between the first connection electrodes 161 and 163 and the second connection electrode 162 to prevent the first connection electrodes 161 and 163 and the second connection electrode 162 from being in contact with each other.

The first connection electrodes 161 and 163 and the second connection electrode 162 may be formed by printing paste including a conductive material or using a method such as plating, sputtering, and the like.

A cover layer 183 may be disposed on the first connection electrodes 161 and 163, the second connection electrode 162, and the insulating layer 184. The cover layer 183 may be a polymer resin such as an epoxy but is not limited thereto. The cover layer 183 may serve to protect the capacitor 100 from an external impact, a conductive foreign material, or the like.

FIGS. 5 to 8 are schematic top plan views of the pillar 120.

Figure 8:
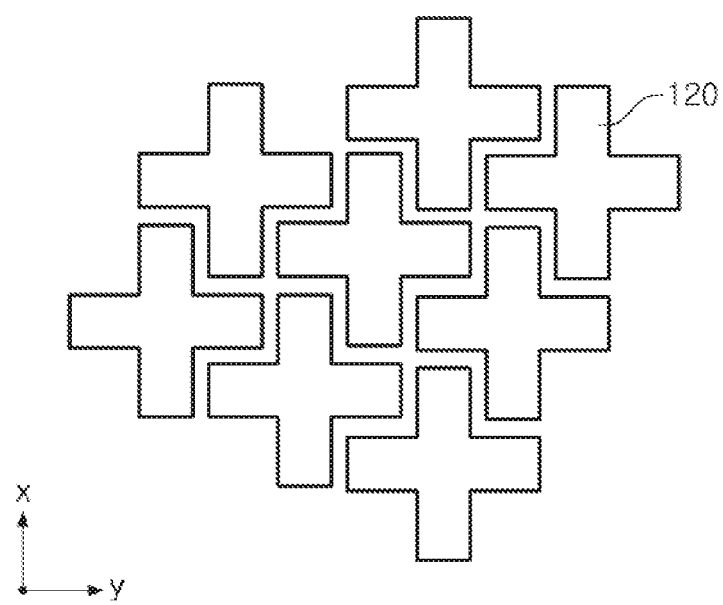

The upper surface of the pillar 120 may have a quadrangular shape (FIG. 5), a circular shape (FIG. 6), a triangular shape (FIG. 7), or a cross shape (FIG. 8). Density of the pillars 120 per unit area is highest when the upper surface of each of the pillars 120 has a quadrangular shape, and ease in process is highest when the upper surface of the pillar 120 has a circular shape. Also, durability regarding collapse is highest when the upper surface of the pillar 120 has a cross shape.

Figure 9:
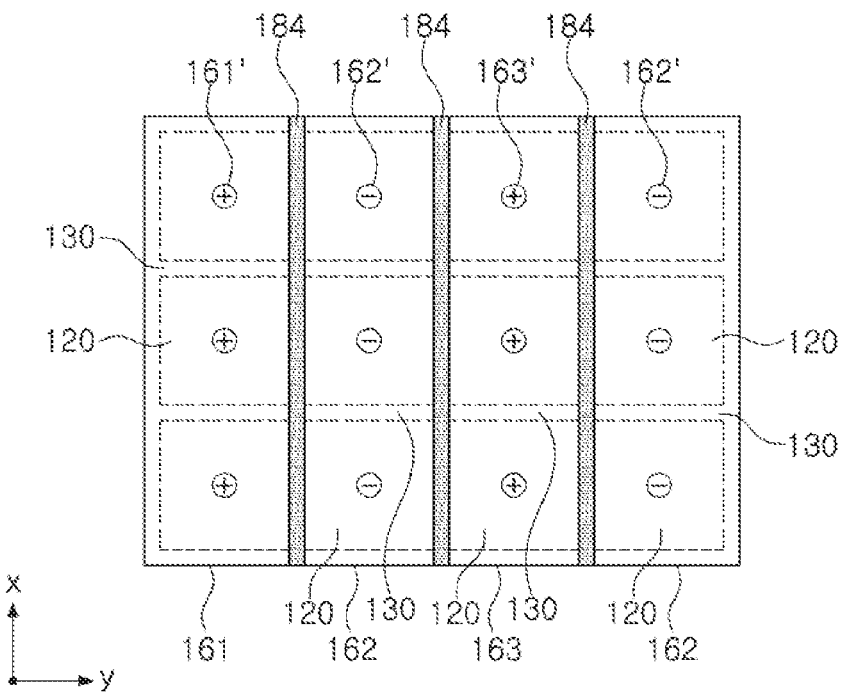
FIG. 9 is a schematic plan view illustrating a layout of pillars and connection electrodes when an upper surface of each pillar has a quadrangular shape and FIG. 10 is a schematic plan view illustrating a layout of pillars and connection electrodes when an upper surface of each pillar has a cross shape.
Figure 10:
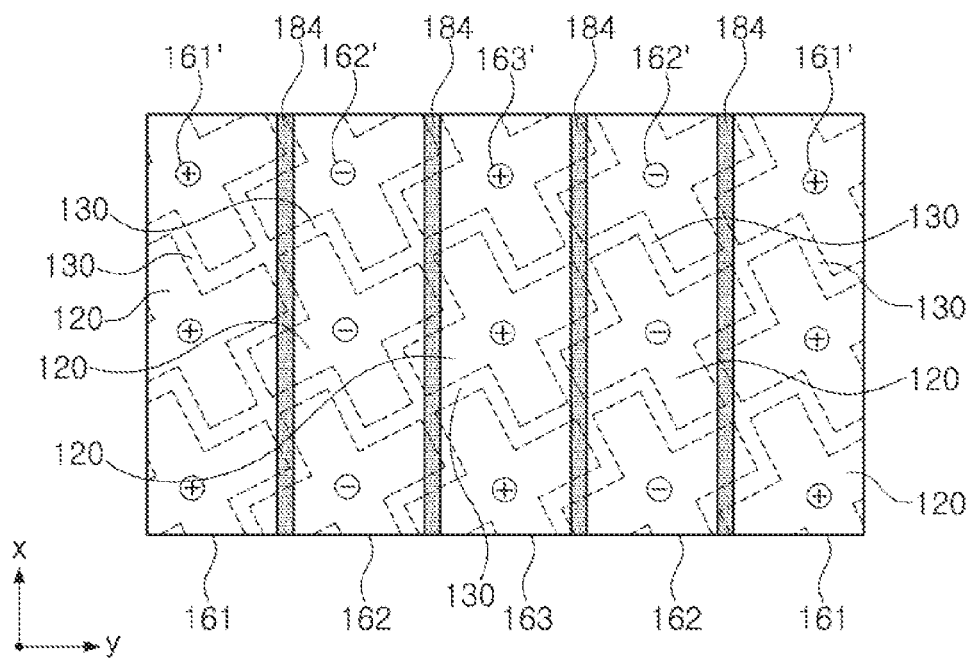

FIGS. 9 and 10 are schematic plan views illustrating a layout of pillars and connection electrodes when an upper surface of each pillar has a quadrangular shape and a cross shape.

Referring to FIGS. 9 and 10, the first connection electrodes 161 and 163 and the second connection electrode 162 may extend in the first direction (X). Via electrodes 161', 162', and 163' are formed on upper surfaces of at least some of the pillars 120. The first connection electrodes 161 and 163 and the second connection electrode 162 may be alternately disposed in the second direction (Y). The insulating layer 184 is disposed between the first connection electrodes 161 and 163 and the second connection electrode 162 in the second direction (Y).

As the first connection electrodes 161 and 163 are connected to an external electrode having a positive (+) polarity, the first electrodes 141 and 143 have the positive (+) polarity, and as the second connection electrode 162 is connected to an external electrode having a negative (−) polarity, the second electrode 142 has the negative (−) polarity.

Figure 11:
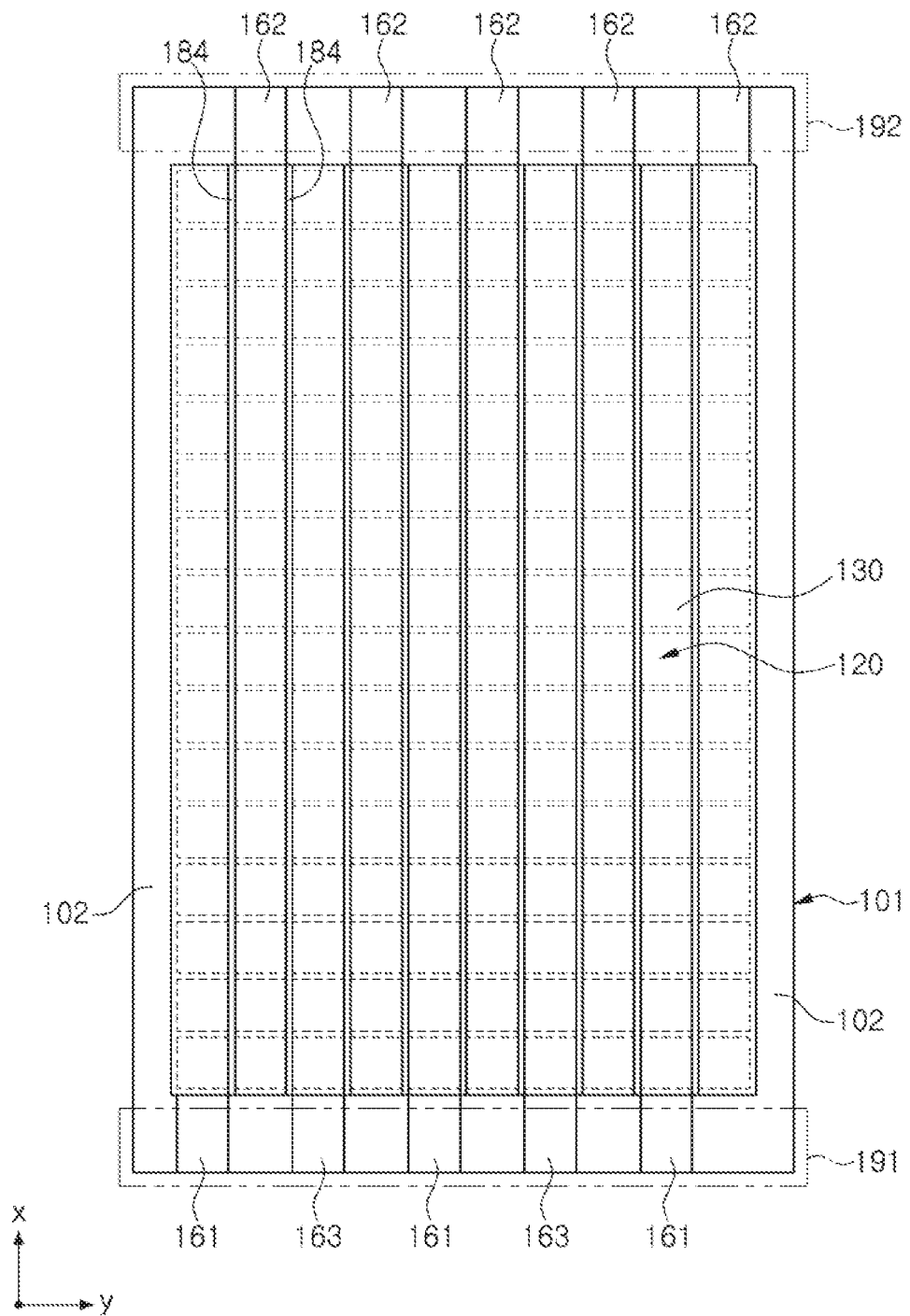
FIG. 11 is a schematic plan view of a capacitor without a cover layer according to an exemplary embodiment in the present disclosure.

FIG. 11 is a schematic plan view of the capacitor without the cover layer according to an exemplary embodiment in the present disclosure.

Referring to FIG. 11, first and second external electrodes 191 and 192 are disposed on external surfaces of the body 101, for example, on opposing cross-sections of the body 101 in the first direction (X). The first external electrode 191 and the second external electrode 192 may be formed by dipping opposing cross-sections of the body 101 in the first direction (X) to paste including a conductive material. As necessary, a plated layer may be further provided on the first external electrode 191 and the second external electrode 192. The first and second external electrodes 191 and 192 may also be disposed on a mounting surface of the capacitor 100, unlike the configuration of FIG. 11.

The first connection electrodes 161 and 163 may extend to a position corresponding to the first external electrode 191 in one direction of the first direction X so as to be in contact with the first external electrode 191. Also, the second connection electrode 162 may extend to a position corresponding to the second external electrode 192 in the other direction of the first direction X so as to be in contact with the second external electrode 192.

A marginal portion 102 may be disposed on both sides of the body 101 in the second direction Y. The marginal portion 102 may serve to prevent an introduction of a conductive foreign material, or the like, to an inner side of the capacitor 100.

Mounting Board Having Capacitor

Figure 12:
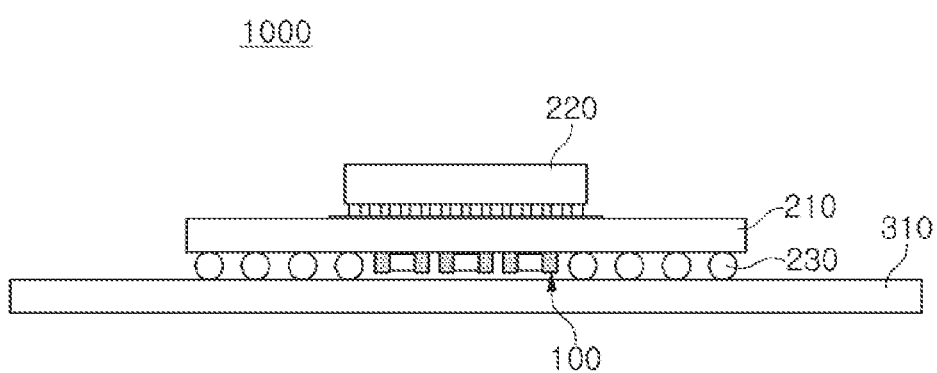
FIG. 12 is a schematic cross-sectional view of a mounting board having a capacitor according to another exemplary embodiment in the present disclosure.

FIG. 12 is a schematic cross-sectional view of a mounting board having a capacitor according to another exemplary embodiment in the present disclosure.

Referring to FIG. 12, a mounting board 1000 having a capacitor according to another exemplary embodiment in the present disclosure includes a board 210, a semiconductor chip 220 disposed on one surface of the board 210, and a capacitor 100 disposed on the other surface of the board 210.

Here, as the capacitor 100, the capacitor 100 according to an exemplary embodiment in the present disclosure described above may be used. The capacitor 100 according to an exemplary embodiment in the present disclosure is also termed a thin film capacitor. The thin film capacitor advantageously has low ESL, unlike the related art multilayer ceramic capacitor, and thus, an application of the thin film capacitor as a decoupling capacitor for an application processor (AP) has been reviewed. In particular, in cases in which the capacitor is used as a decoupling capacitor, the capacitor is required to be disposed adjacently to an AP, and thus, in the mounting board 1000 of the capacitor according to another exemplary embodiment in the present disclosure, the semiconductor chip 220 may be disposed on one surface of the board 210 and the capacitor 100 may be disposed on the other surface of the board 210 in a position opposing the semiconductor chip 220.

The capacitor 100 disposed in a position opposing the semiconductor chip 220 is known as a land-side capacitor (LSC). Since the LSC type capacitor 100 is disposed on the other surface of the board 210 in a position opposing the semiconductor chip 220, in order to mount the board 210 on a main board 310, the capacitor 100 should be thinner than solder balls 230 and it is required to minimize an area from which solder balls are removed by designing the capacitor 100 as small as possible. The surface of the board 210 on which the capacitor 100 is mounted may be provided as a mounting surface to mount the board 210 onto the main board 310, such that the mounting surface of the board 210 faces the main board 310.

In the mounting board 1000 having a capacitor according to an exemplary embodiment in the present disclosure, since the capacitor 100 includes a plurality of pillars, in which a lower portion thereof is wider than an upper portion thereof, in an upper portion of a support member and lower end portions of adjacent pillars are disposed to be in contact with each other, enhancing density of pillars per unit area to significantly increase an overall surface area realizing capacity of the capacitor, whereby the capacitor 100 may be reduced in size and thickness, while having enhanced capacity.

As set forth above, according to an exemplary embodiment in the present disclosure, since the capacitor includes a plurality of pillars, in which a lower portion thereof is wider than an upper portion thereof, in an upper portion of a support member and lower end portions of adjacent pillars are disposed to be in contact with each other, density of pillars per unit area is enhanced to significantly increase an overall surface area realizing capacity of the capacitor, whereby the capacitor may be reduced in size and thickness, while having enhanced capacity.

While example embodiments have been shown and described above, it will be apparent to those skilled in the art that modifications and variations could be made without departing from the scope of the present invention as defined by the appended claims.

What is claimed is:

1. A capacitor comprising:
   a body including a support member;
   first and second pillars disposed in an upper portion of the support member, the first pillar having a first upper portion and a first lower portion wider than the first upper portion and the second pillar having a second upper portion and a second lower portion wider than the second upper portion; and
   a capacitor layer disposed on the first upper portion and one or more first side surfaces of the first pillar, and the second upper portion and one or more second side surfaces of the second pillar,
   wherein the capacitor layer includes a dielectric layer and first and second electrodes alternately disposed with the dielectric layer interposed therebetween,
   the one or more first side surfaces meet a first upper surface of the first upper portion of the first pillar,
   the one or more second side surfaces meet a second upper surface of the second upper portion of the second pillar, and
   a cross-section of one of the one or more first side surfaces and an adjacent one of the one or more second side surfaces defines a V shape.

2. The capacitor of claim 1, wherein a shape of the upper surface of each of the first and second upper portions is at least one of quadrangular, circular, triangular, and cross shapes.

3. The capacitor of claim 1, wherein the capacitor layer includes a plurality of dielectric layers.

4. The capacitor of claim 1, further comprising:
an insulating layer disposed on the capacitor layer;
a first via electrode penetrating from the insulating layer in a direction towards the first upper portion of the first pillar and electrically connected to a portion of the first electrode disposed on the first upper portion of the first pillar; and
a second via electrode penetrating from the insulating layer in a direction towards the second upper portion of the second pillar and electrically connected to a portion of the second electrode disposed on the second upper portion of the second pillar.

5. The capacitor of claim 4, further comprising:
a first connection electrode disposed on the insulating layer, extending in a first direction of the body, and connected to the first via electrode; and
a second connection electrode disposed on the insulating layer, extending in the first direction of the body, and connected to the second via electrode.

6. The capacitor of claim 5, further comprising:
first and second external electrodes disposed on an external surface of the body,
wherein the first connection electrode extends in the first direction to a position corresponding to the first external electrode and is electrically connected to the first external electrode, and
the second connection electrode extends in the first direction to a position corresponding to the second external electrode and is electrically connected to the second external electrode.

7. A mounting board, comprising:
a board;
a semiconductor chip disposed on one surface of the board; and
a capacitor disposed on the other surface of the board opposing the one surface,
wherein the capacitor comprises:
a body including a support member;
first and second of pillars disposed in an upper portion of the support member, the first pillar having a first upper portion and a first lower portion wider than the first upper portion and the second pillar having a second upper portion and a second lower portion wider than the second upper portion; and
a capacitor layer disposed on the first upper portion and one or more first side surfaces of the first pillar, and the second upper portion of the second pillar and one or more second side surfaces of the second pillar,
wherein the capacitor layer includes a dielectric layer and first and second electrodes alternately disposed with the dielectric layer interposed therebetween,
the one or more first side surfaces meet a first upper surface of the first upper portion of the first pillar,
the one or more second side surfaces meet a second upper surface of the second upper portion of the second pillar, and
a cross-section of one of the one or more first side surfaces and an adjacent one of the one or more second side surfaces defines a V shape.

8. The mounting board of claim 7, wherein a shape of the upper surface of each of the first and second upper portions is at least one of quadrangular, circular, triangular, and cross shapes.

9. The mounting board of claim 7, wherein the capacitor layer includes a plurality of dielectric layers.

10. The mounting board of claim 7, wherein the capacitor further comprises:
an insulating layer disposed on the capacitor layer;
a first via electrode penetrating from the insulating layer in a direction towards the first upper portion of the first pillar and electrically connected to a portion of the first electrode disposed on the first upper portion of the first pillar; and
a second via electrode penetrating from the insulating layer in a direction towards the second upper portion of the second pillar and electrically connected to a portion of the second electrode disposed on the second upper portion of the second pillar.

11. The mounting board of claim 10, wherein the capacitor further comprises:
a first connection electrode disposed on the insulating layer, extending in a first direction of the body, and connected to the first via electrode; and
a second connection electrode disposed on the insulating layer, extending in the first direction of the body, and connected to the second via electrode.

12. The mounting board of claim 11, wherein the capacitor further comprises:
first and second external electrodes disposed on an external surface of the body,
wherein the first connection electrode extends in the first direction to a position corresponding to the first external electrode and is electrically connected to the first external electrode, and
the second connection electrode extends in the first direction to a position corresponding to the second external electrode and is electrically connected to the second external electrode.

* * * * *